(12) United States Patent
Frei et al.

(10) Patent No.: US 10,429,482 B2
(45) Date of Patent: Oct. 1, 2019

(54) DE-EMBEDDING AND CALIBRATION OF MIRROR SYMMETRIC RECIPROCAL NETWORKS

(71) Applicant: Oracle International Corporation, Redwood City, CA (US)

(72) Inventors: James M. Frei, Sunol, CA (US);
Jyotika Singh, San Jose, CA (US);
Connie K. Szeto, Escondido, CA (US);
Ryan Travis Caldwell, San Diego, CA (US); Kenneth F. Hatch, Sunol, CA (US)

(73) Assignee: Oracle International Corporation, Redwood City, CA (US)

( * ) Notice: Subject to any disclaimer, the term of this patent is extended or adjusted under 35 U.S.C. 154(b) by 1309 days.

(21) Appl. No.: 14/292,275

(22) Filed: May 30, 2014

(65) Prior Publication Data

US 2015/0346310 A1  Dec. 3, 2015

(51) Int. Cl.
*G01R 35/00* (2006.01)
*G01R 27/32* (2006.01)

(52) U.S. Cl.
CPC ........... *G01R 35/005* (2013.01); *G01R 27/32* (2013.01)

(58) Field of Classification Search
CPC ............................. G01R 35/005; G01R 27/32
See application file for complete search history.

(56) References Cited

U.S. PATENT DOCUMENTS 6,956,362 B1 * 10/2005 Campbell .......... G01R 1/06788
324/72.5
7,109,728 B2 * 9/2006 Crook ................ G01R 1/06766
324/115

(Continued)

FOREIGN PATENT DOCUMENTS

WO    2008021885 A2    2/2008

OTHER PUBLICATIONS

Shuhei Amakawa, Noboru Ishihara and Kazuya Masu (2010), A Thru-Only De-Embedding Method for On-Wafer Characterization of Multiport Networks, Advanced Microwave Circuits and Systems, Vitaliy Zhurbenko (Ed.), pp. 13-32, ISBN: 978-953-307-087-2.

(Continued)

*Primary Examiner* — Mohamed Charioui
*Assistant Examiner* — Catherine T. Rastovski
(74) *Attorney, Agent, or Firm* — Brooks Kushman P.C.

(57) ABSTRACT

A method for characterization of fixture utilizes a mirror symmetric THRU structure and either a HALF-THRU with a LOAD shunted to ground or a THRU with a LOAD shunted to ground located at the mirror reference plane. The method extracts the short, open, and thru measurements from the THRU structure due to the mirror symmetry. The HALF-THRU with a LOAD or the THRU with a LOAD shunted to ground located at the mirror reference plane provides the independent measurement to fully characterize the fixture. The resultant impedance or scattering parameter HALF-THRU model may be used in de-embedding a Device-Under-Test, a calibration routine, or computational (Continued)

simulations. The parameters of a HALF-THRU model may be stored in a memory storage circuit affixed to the associated HALF-THRU fixture. Some embodiments may include at least one memory storage circuit that attaches to the HALF-THRU fixture body affixed to an interposing matable connector.

16 Claims, 10 Drawing Sheets

(56) References Cited

U.S. PATENT DOCUMENTS

| | | | | |
|---|---|---|---|---|
| 7,271,575 | B2* | 9/2007 | Pickerd | G01R 13/22 324/642 |
| 7,405,575 | B2* | 7/2008 | Tan | G01R 35/005 324/601 |
| 7,408,363 | B2* | 8/2008 | Tan | G01R 35/005 324/601 |
| 7,414,411 | B2* | 8/2008 | Tan | G01R 1/06772 324/601 |
| 7,432,698 | B1* | 10/2008 | Campbell | G01R 1/06788 324/72.5 |
| 7,460,983 | B2* | 12/2008 | Pickerd | G01R 31/3191 702/104 |
| 7,492,170 | B2* | 2/2009 | Crook | G01R 1/06766 324/690 |
| 8,000,919 | B2* | 8/2011 | Tan | G01R 27/32 324/601 |
| 9,772,391 | B2* | 9/2017 | Pickerd | G01R 35/00 |
| 2004/0027138 | A1* | 2/2004 | Pickerd | G01R 13/22 324/646 |
| 2004/0164752 | A1* | 8/2004 | Crook | G01R 1/06766 324/725 |
| 2005/0185768 | A1* | 8/2005 | Pickerd | 379/30 |
| 2005/0185769 | A1* | 8/2005 | Pickerd | G01R 35/005 379/30 |
| 2006/0140349 | A1* | 6/2006 | Tan | G01R 35/005 379/30 |
| 2006/0182231 | A1* | 8/2006 | Tan | G01R 13/029 379/30 |
| 2006/0210022 | A1* | 9/2006 | Tan | G01R 35/005 379/30 |
| 2006/0279295 | A1* | 12/2006 | Crook | G01R 1/06766 324/690 |
| 2007/0041511 | A1* | 2/2007 | Tan | G01R 13/029 379/30 |
| 2007/0041512 | A1* | 2/2007 | Pickerd | G01R 35/005 379/30 |
| 2007/0273389 | A1* | 11/2007 | Tan | G01R 35/002 324/638 |
| 2007/0276614 | A1* | 11/2007 | Tan | G01R 27/32 702/55 |
| 2007/0276622 | A1* | 11/2007 | Pickerd | G01R 35/002 702/106 |
| 2008/0048673 | A1* | 2/2008 | Tan | G01R 35/005 324/601 |
| 2008/0048674 | A1* | 2/2008 | Tan | G01R 35/005 324/601 |
| 2008/0048677 | A1* | 2/2008 | Tan | G01R 35/005 324/638 |
| 2008/0052028 | A1* | 2/2008 | Pickerd | G01R 31/3191 702/104 |
| 2008/0278176 | A1* | 11/2008 | Hagerup | G01R 27/32 324/601 |
| 2008/0281542 | A1* | 11/2008 | Tan | G01R 27/32 702/85 |
| 2015/0084655 | A1* | 3/2015 | Pickerd | G01R 1/06788 324/750.01 |
| 2015/0084656 | A1* | 3/2015 | Pickerd | G01R 35/005 324/750.01 |
| 2015/0212185 | A1* | 7/2015 | Pickerd | G01R 35/00 324/750.02 |

OTHER PUBLICATIONS

Two-Port Network, http://en.wikipedia.org/w/index.php?oldid=601924176 (accessed Apr. 12, 2014), pp. 1-15.
Chapter 14 Two-Port Networks, http://ultrasound.ee.ntu.edu.tw/wwwroot_e/classnotes/ckt2/Chapter14.pdf (accessed Mar. 13, 2014), pp. 196-210.

* cited by examiner

DE-EMBEDDING AND CALIBRATION OF MIRROR SYMMETRIC RECIPROCAL NETWORKS

TECHNICAL FIELD

This disclosure relates to the field of test and measurement, and in particular focuses on methods for de-embedding and calibrating using mirror symmetric, reciprocal test structures.

BACKGROUND

Often it is necessary to attach mate-able fixtures between the device under test (DUT) and a vector network analyzer (VNA) in order to measure and characterize circuitry. These fixtures tend to electrically interfere with the measurements causing erroneous results.

To compensate for these errors, industry has adopted standards that utilize calibration structures and procedures to calibrate or de-embed out errors not compensated internally by the VNA. The most common calibration structures are Thru-Reflect-Match (LRM), Thru-Reflect-Reflect-Match (LRRM), Thru-Reflect-Line (TRL or LRL), Short-Open-Load-Thru (SOLT), and Short-Open-Load-Reciprocal (SOLR). Ideally, these structures may be used with any VNA and will effectively compensate all errors within the bandwidth of the fixtures and VNA.

In practice, not all calibration structures may be used with any VNA since the VNA should have the circuitry, programming algorithms, and user interfaces for each calibration structure. Therefore, many circuit designs and tests are limited by the capabilities of the VNA. Furthermore, the calibration procedures and structures do not characterize any of the limitations of the fixtures themselves, such as bandwidth, cross-talk, and insertion loss. Instead, these fundamental measurements are deferred to the fixture manufactures and may be available in the components data-sheet or manufactures website. Engineers should be aware of these fixture limitations. Otherwise no matter how accurate the calibration, the fixture limitations may invalidate the measurements.

De-embedding is another method that is utilized to characterize the DUT. De-embedding is a method of mathematically removing the parasitic interference from measurement fixtures. The exact structural embodiment of these fixtures varies from simplistic mating connectors, such as thin-wire-probes, to very complex networks, such as micro-traces, vias, striplines, wire-bonds, etc. The ability to mathematically remove these parasitic effects hinges on accurately characterizing the connected test fixtures. As such, current de-embedding methods rely almost exclusively on the aforementioned calibration standards to characterize test fixtures.

SUMMARY

Methods to fully characterize 2-port test fixtures utilizing two test structures, in certain examples, use a mirror symmetric THRU and either a HALF-THRU with a LOAD shunted to ground or a THRU with a LOAD shunted to ground located at the mirror reference plane. The symmetry from the mirror symmetric THRU structure derives the HALF-THRU open circuit and HALF-THRU short circuit conditions, as well as a relation between the open impedance at the mirror reference plane and the transmitted impedance from the input port to the reference plane for the HALF-THRU fixture. The second structure adds a load to the HALF-THRU fixture to provide the second linearly independent relation that allows full characterization of the fixture. The resultant impedance or scattering parameter HALF-THRU model can be used in de-embedding a Device-Under-Test (DUT), in a calibration routine or in computational simulations. In order to prevent the disassociation of a HALF-THRU fixture with its corresponding HALF-THRU model, some embodiments include at least one memory storage circuit that attaches to the HALF-THRU fixture body which is configured to store the impedance or scattering parameters. Other embodiments may include the memory storage circuits affixed to an interposing matable connector.

BRIEF DESCRIPTION OF THE DRAWINGS

FIGS. 12, 12-1, 12-2, 12-3, and 12-4 are block diagrams of a method for characterizing ports of a test fixture including a pair of HALF-THRUS connected at a mirror reference plane and arranged to form a mirror symmetric THRU.

FIGS. 13, 13-1, 13-2, and 13-3 are block diagrams of an apparatus for characterizing ports of a test fixture including a pair of HALF-THRUS connected at a mirror reference plane and arranged to form a mirror symmetric THRU.

DETAILED DESCRIPTION

Figure 1:
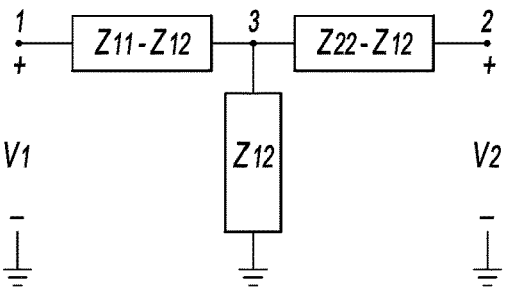
FIG. 1 is a 2-port, Z-parameter T network equivalent model representation for a left test fixture with impedance, $Z_{11}$-$Z_{12}$, connected between nodes 1 and 3, impedance, $Z_{12}$, connected between node 3 and ground, and impedance, $Z_{22}$-$Z_{12}$, connected between nodes 3 and 2, whereby node 2 is located at the mirror reference plane.

Embodiments of the present disclosure are described herein. It is to be understood, however, that the disclosed embodiments are merely examples and other embodiments may take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

S-Parameters

The S-parameters form the S-matrix in which each element has a direct physical significance to the network, which is most apparent in the diagonal of the S-matrix with each element being the reflection coefficient for a pertinent port. Generally, the S-matrix is obtained by measuring the normalized incident wave, a, and dividing it by the normalized reflected wave, b, while properly terminating the remaining ports such that no reflections are generated by the terminated ports. Mathematically, the S-parameters may be represented as $$S_{ij} = \frac{b_i}{a_j}\bigg|_{a_k=0, k \neq j} \qquad (1)$$

It should be noted that other than knowing the characteristic impedance for proper termination, nothing needs to be known of the circuitry for the S-parameters when measured. Thus, the circuit may be thought of as a "black box" being fully characterized by the S-parameters. This may be important at higher frequencies when unintended frequency-dependent elements, such as antennas and stubs, may change the behavior of the desired circuit response. In short, S-parameters are preferred simply due to the ease at which the measurement is generated, the physical significance of each element, and the ability to fully characterize the circuitry without knowing all the circuit elements.

T-Parameters

The main drawback of the S-matrix is that it is not suitable for a direct cascading relationship. Instead, the normalized incident and reflected waves should be adapted for simple matrix multiplication. The result is the scattering transfer matrix or T-matrix in which the effect of cascading two or more multi-port networks is found by multiplying sequentially the associated T-matrices. Mathematically, this is represented as $$[T_{Total}] = [T_L][T_R] \qquad (2)$$

where the $T_L$ and $T_R$ adhere to all matrix multiplication rules including the commutative property of matrices, which maintains port ordering. Thus, the matrix multiplication order is significant since connecting port 2 of $T_L$ to port 1 of $T_R$ will not necessarily yield the same results as connecting port 2 of $T_R$ to port 1 of $T_L$. This is equivalent to mathematically saying $$[T_{total}] = [T_L][T_R] \neq [T_R][T_L] \qquad (3)$$

Because the T-matrix adheres to the commutative property of matrices the number of T-parameters may not always equal the number of S-parameters for a corresponding S-matrix. For example, a 3-port network with one port on the left and two ports on the right forms a 3×3 S-matrix for a total of nine S-parameters, whereas the corresponding T-matrix forms a 2×4 matrix for a total of eight T-parameters.

Equations (4) and (5) show the conversion between the S-to-T and T-to-S for multi-port networks with 2-port symmetry.

$$\begin{pmatrix} T_{11} & T_{12} \\ T_{21} & T_{22} \end{pmatrix} = \begin{pmatrix} S_{12} - S_{11}S_{21}^{-1}S_{22} & S_{11}S_{21}^{-1} \\ -S_{21}^{-1}S_{22} & S_{21}^{-1} \end{pmatrix} \qquad (4)$$

$$\begin{pmatrix} S_{11} & S_{12} \\ S_{21} & S_{22} \end{pmatrix} = \begin{pmatrix} T_{12}T_{22}^{-1} & T_{11} - T_{12}T_{22}^{-1}T_{21} \\ T_{22}^{-1} & -T_{22}^{-1}T_{21} \end{pmatrix} \qquad (5)$$

Z- and Y-Parameters

The impedance parameters or Z-parameters have their roots deep in electrical engineering and circuit network analysis, and are used in methods to fully characterize electrical networks. This fundamental concept is similar to the S-parameters. If the Z-parameters are known, nothing need be known of the circuitry, and the circuit may be thought of as a "black box" being fully characterized at the ports. Also, the Z-parameters are easy to visualize since it is the implementation of Ohm's Law or $$[V] = [Z][I] \qquad (6)$$

The Z-parameters are measured one port at a time with the remaining ports open, which is mathematically equivalent to $$Z_{nm} = \frac{V_n}{I_m}\bigg|_{I_k=0, k \neq m} \qquad (7)$$

Likewise, the Y-matrix consisting of the Y-parameters (or conductance parameters), is the matrix inverse of the Z-matrix and is yet another method to fully characterizes a network. The Y-parameters are derived from Ohm's Law and take to the form $$[I] = [Y][V] = [Z]^{-1}[V] \qquad (8)$$

In many circuit network applications containing only resistors, inductors, and capacitors, there is a great deal of symmetry in the Z-matrix in which the open circuit transfer impedances are equal. These networks are known as reciprocal (mirror symmetric) networks and for 2-port networks may be modeled according to FIG. 1. One of the characteristics of reciprocal networks is that the symmetry in the Z-matrix translates into the S-matrix and Y-matrix. Thus, 2-port reciprocal network equivalence may be expressed as $$Z_{12}=Z_{21} \Leftrightarrow S_{12}=S_{21} \Leftrightarrow Y_{12}=Y_{21} \qquad (9)$$

Other circuit model implementations of a reciprocal network shown in FIG. 1 are possible as may be shown using the equivalent Y-parameter model derived by completing the corresponding T-to-PI transformation.

Equations (10) and (11) show the conversion between the S-to-Z and Z-to-S for 2-port networks:

$$\begin{pmatrix} Z_{11} & Z_{12} \\ Z_{21} & Z_{22} \end{pmatrix} = \quad (10)$$

$$\begin{pmatrix} \frac{(1+S_{11})(1-S_{22})+S_{12}S_{21}}{(1-S_{11})(1-S_{22})-S_{12}S_{21}} & \frac{2S_{12}Z_0}{(1-S_{11})(1-S_{22})-S_{12}S_{21}} Z_0 \\ \frac{2S_{21}Z_0}{(1-S_{11})(1-S_{22})-S_{12}S_{21}} & \frac{(1-S_{11})(1+S_{22})+S_{12}S_{21}}{(1-S_{11})(1-S_{22})-S_{12}S_{21}} Z_0 \end{pmatrix}$$

$$\begin{pmatrix} S_{11} & S_{12} \\ S_{21} & S_{22} \end{pmatrix} = \quad (11)$$

$$\begin{pmatrix} \frac{(Z_{11}-Z_0)(Z_{22}+Z_0)-Z_{12}Z_{21}}{(Z_{11}+Z_0)(Z_{22}+Z_0)-Z_{12}Z_{21}} & \frac{2Z_0 Z_{12}}{(Z_{11}+Z_0)(Z_{22}+Z_0)-Z_{12}Z_{21}} \\ \frac{2Z_0 Z_{21}}{(Z_{11}+Z_0)(Z_{22}+Z_0)-Z_{12}Z_{21}} & \frac{(Z_{11}+Z_0)(Z_{22}-Z_0)-Z_{12}Z_{21}}{(Z_{11}+Z_0)(Z_{22}+Z_0)-Z_{12}Z_{21}} \end{pmatrix}$$

It should be noted that the circuit model when represented using Z-, Y-, or S-parameters like the one shown in FIG. 1 is not the circuit itself but rather a representation of the "black box" measurements. In other words, the circuit is only fully characterized at the ports whereas the "true internal circuitry" is unknown. It is thus improper to infer any internal circuit behavior by making any internal calculations for measurements of the modeled circuit. This may become important in instances when it is desired to add a new port within the 'black box". For example, if the 'black box" is defined according to the circuit model in FIG. 1 and it is desired to add a port by dividing the network at node 3, the new circuit model becomes a cascaded network of FIG. 1 whereby the impedances within the 'black box" at node 3 are measured and characterized. One should not simply split $Z_{12}$ in half by adding $2Z_{12}$ in parallel and assume that one half of the circuit contains only $Z_{11}$ and $2Z_{12}$ with the second half containing only $Z_{22}$ and $2Z_{12}$. This condition would incorrectly force the impedances in both directions at the new port at node 3 to be equal to $2Z_{12}$, thereby forcing three of the four Z-parameters for the "split model" to be equal. (The Z-parameters for the measured split model illustrated in FIG. 6 and FIG. 7 validate that this is not the case—only two (not three) of the Z-parameters are equal.)

De-Embedding—Traditional Techniques

Practically all de-embedding techniques stem from the same procedure of converting S-parameters of the known fixtures to T-parameters using equation (4) then solving for the T-matrix of the DUT whereby the $T_{DUT}$ matrix is converted back to the equivalent S-matrix using equation (5). Mathematically, the total structure is often shown as $$[T_{Total}] = [T_L][T_{DUT}][T_R] \quad (12)$$

where $T_{Total}$ is calculated from the measured S-parameters, and $T_L$ and $T_R$ are left and right test fixtures. When the left test fixture, $T_L$, and the right test fixture, $T_R$, are known, the de-embedded response of $T_{DUT}$ becomes $$[T_{DUT}] = [T_L]^{-1}[T_{Total}][T_R]^{-1} \quad (13)$$

There are two traditional techniques to determine the test circuit response for the test fixtures $T_L$ and $T_R$. The first is to build test structures that mimic the test fixtures under certain conditions. These test structures are often referred as "cal-kits" and use "calibration standards" since when measuring the structures, the associated test fixtures represented in the test structures are mathematically calibrated out, leaving only the circuit response of the test fixture.

Typically, there are three test structures per kit but depending on which calibration technique used, more may be required. Common calibration standards include, Through-Reflect-Match (TRM), Line-Reflect-Match (LRM), Through-Reflect-Line (TRL), Line-Reflect-Line (LRL), and Short-Open-Line-Through (SOLT). Lastly, the choice of which calibration standard to use varies since each has strengths and weaknesses and each utilizes reasonable assumptions that when followed deliver valid results.

The second technique simulates the circuit response of each test fixture, $T_L$ and $T_R$, through commercially available simulators such as ADS, HFFS, SISoft, and the like. The advantage with this method is that it saves time since it eliminates the need for "cal-kit" measurements and it produces a circuit model that provides more insight into the inter-workings of the network connected to the DUT. The drawback is that without measurement validation there is no guarantee that the circuit model is correct, and if wrong will completely invalidate the de-embedded results for $T_{DUT}$. Due to this uncertainty, simulator models are generally used in addition to "cal-kits" rather than replacing them.

Figure 6:
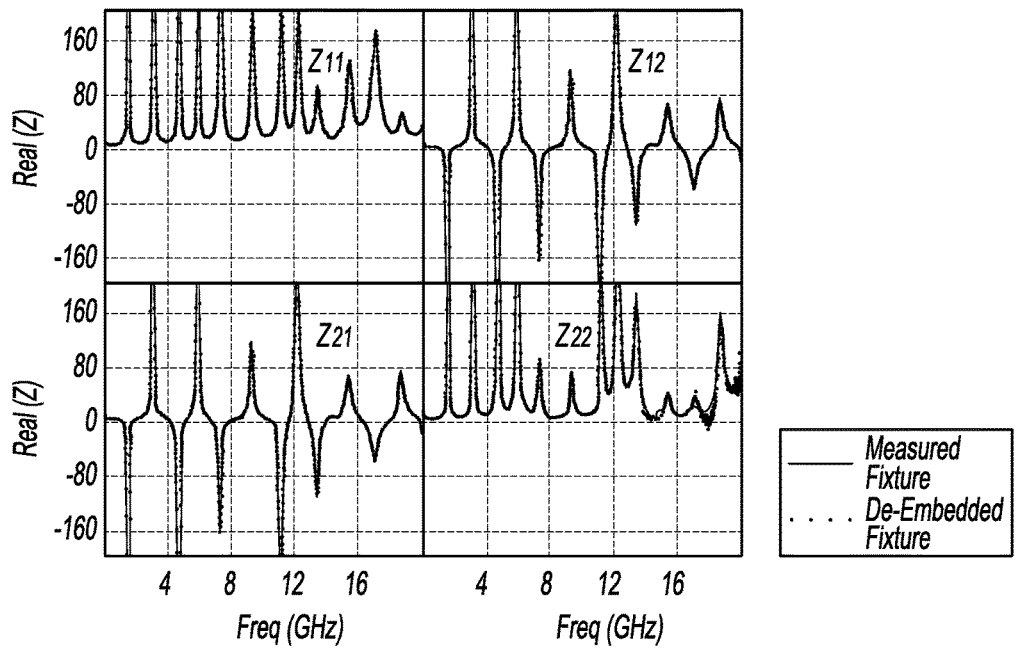
FIG. 6 is a plot of the real part of the 2-port, Z-parameters for the left test fixture.
Figure 7:
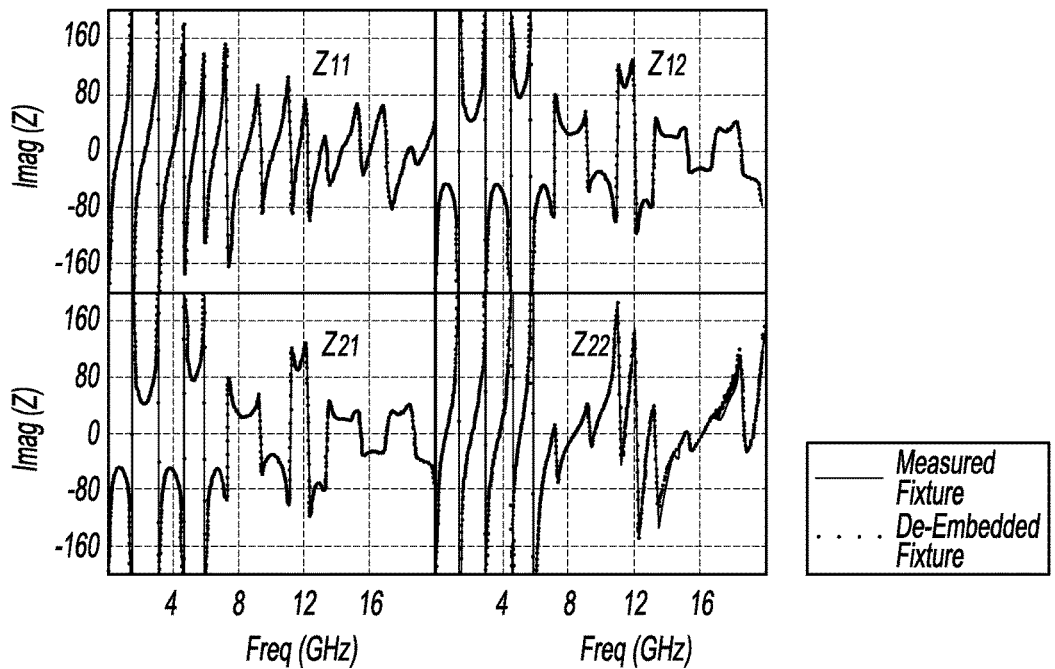
FIG. 7 is a plot of the imaginary part of the 2-port, Z-parameters for the left test fixture.

There is a more recent technique known as the thru-only de-embedding method which claims the ability to characterize both the left and right test fixtures of reciprocal networks with a single thru-only measurement. The authors correctly convert the S-parameters to Y-parameters and utilize a Y-parameter PI circuit model. However, the authors incorrectly divide the Y-parameter PI-model in half and create a new port within the "black-box" without allowing new conductance parameters to be generated to account for the conductances of $Y_{22new}$ and $Y_{11new}$ at the new port. Instead, the authors force a T-model structure rather than correctly dividing the PI-model into 2 cascaded PI-models. This invalid assumption forces three of the four Y-parameters to be equal which also forces three of the four Z-parameters to be equal. (FIG. 6 and FIG. 7 illustrate valid Z-parameter measurements of the left test fixture of a reciprocal network and show that only two of four parameters are equal.)

The Thru-Load Technique

Methods of de-embedding reciprocal mirror symmetric networks are disclosed herein. These methods may have the advantage of time savings by requiring only two test structures, and producing a circuit model for the test fixtures, $T_L$ and $T_R$. The model generation yields the added benefit that the circuit model may be utilized within computer simulators, which may provide further insight for validating and simulating networks. The model may also be integrated into the software of a VNA—eliminating the post-processing de-embedding step.

The model may consist of two test structures for each test fixture, $T_L$ and $T_R$, each comprised of a mirror symmetric THRU and a HALF-THRU with a LOAD located at the mirror reference plane, or a THRU and a THRU with LOAD located at the mirror reference plane. The symmetry of the mirror symmetric THRU causes an impedance of the modeled HALF-THRU (a mirror symmetric one-half of the THRU) to be mirrored about the reference plane and the impedance at the mirrored ports to be equal.

Figure 2:
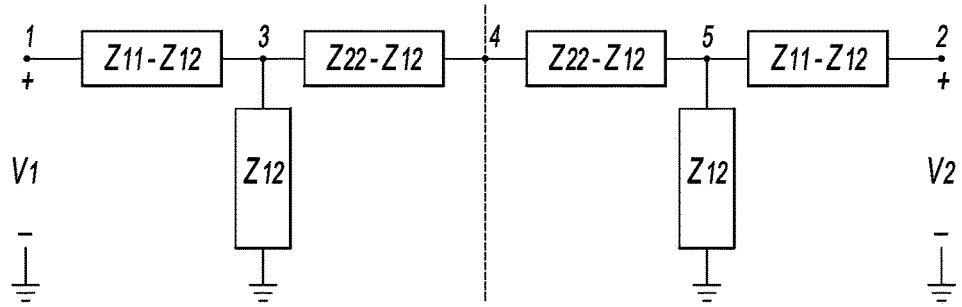
FIG. 2 is a 2-port, Z-parameter T network equivalent model representation for cascaded left and right test fixtures, whereby the right test fixture is mirror symmetric at the mirror reference plane of the left test fixture.

The THRU may be constructed in a manner to ensure that there is mirror symmetry between the two ports with a mirror reference plane located in the center. In the simplest form, this may be accomplished by creating two identical HALF-THRU fixtures, in which each fixture is exactly the same as the fixture connected to the DUT and port 2 of the HALF-THRU fixture is the port that connects to the DUT. With this orientation, port 2 of each HALF-THRU is connected to each other. When connected properly, the circuit model equivalent becomes equivalent to FIG. 2.

Solving for the Z-parameters of the THRU test structure yields (as used herein, input impedance with open output is represented as $Z_{11}$, reverse transfer impedance with open input is represented as $Z_{12}$, forward transfer impedance with open output is represented as $Z_{21}$, and output impedance with open input is represented as $Z_{22}$):

$$\begin{pmatrix} Z_{Thru_{11}} & Z_{Thru_{12}} \\ Z_{Thru_{21}} & Z_{Thru_{22}} \end{pmatrix} = \begin{pmatrix} Z_{11} - \frac{Z_{12}^2}{2Z_{22}} & \frac{Z_{12}^2}{2Z_{22}} \\ \frac{Z_{12}^2}{2Z_{22}} & Z_{11} - \frac{Z_{12}^2}{2Z_{22}} \end{pmatrix} \quad (14)$$

Since this structure has a significant amount of symmetry, from equation (14) the THRU is a reciprocal network where $$Z_{Thru_{12}} = Z_{Thru_{21}} \quad (15)$$

and the open port impedances of the THRU are also equal where $$Z_{Thru_{11}} = Z_{Thru_{22}} \quad (16)$$

What is not intuitive but apparent from equation (14) is that the open circuit of the HALF-THRU (in which port 2 of FIG. 1 is open) is equal to the sum of the port impedances $Z_{Thru_{11}}$ and $Z_{Thru_{21}}$ of the THRU. That is to say $Z_{11}$ of the HALF-THRU may be calculated from the THRU Z-parameters, where $$Z_{11} = Z_{Thru_{11}} + Z_{Thru_{21}} \quad (17)$$

These results are very significant in that by using this method it is possible to extract the THRU, OPEN, and SHORT conditions with one test structure.

Another HALF-THRU relationship that can be found from the THRU is $$Z_{22} = \frac{Z_{12}^2}{2Z_{Thru_{21}}} \quad (18)$$

which yields a single equation with two variables. Thus, a second equation that is linearly independent of equation (18) is useful.

Figure 3:
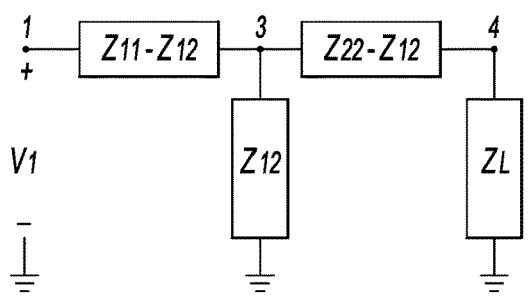
FIG. 3 is a 1-port, Z-parameter T network representation for a left test fixture with a shunt load to ground located at the node at the mirror reference plane.
Figure 4:
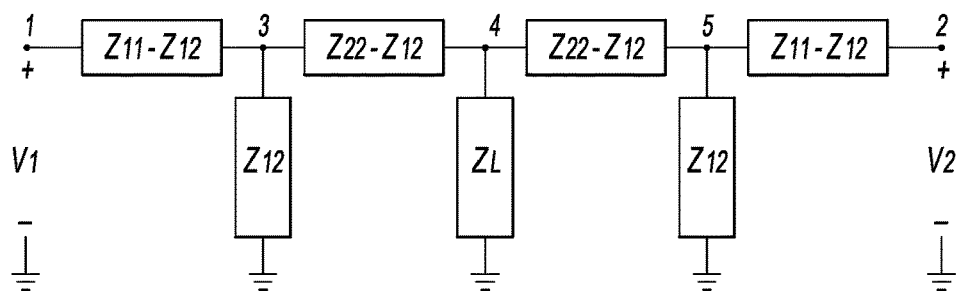
FIG. 4 is a 2-port, Z-parameter T network equivalent model representation for a test fixture comprising a cascaded left test fixture, a shunt load impedance, $Z_L$, from the node located at the mirror reference plane to ground, and a right test fixture, whereby the right test fixture is mirror symmetric at the mirror reference plane of the left test fixture.

Placing an impedance load at the mirror reference plane location as illustrated in FIG. 3 or FIG. 4 will yield the second equation. The input impedance of the HALF-THRU structure for the left side with an impedance load as in FIG. 3 becomes $$Z_{LeftZL_{11}} = Z_{11} - Z_{12} + \frac{Z_{12}(Z_{22} - Z_{12} + Z_L)}{Z_{22} + Z_L} \quad (19)$$

Similarly, the Z-matrix for the THRU structure with an impedance load as in FIG. 4 becomes $$\begin{pmatrix} Z_{ThruZL_{11}} & Z_{ThruZL_{12}} \\ Z_{ThruZL_{21}} & Z_{ThruZL_{22}} \end{pmatrix} = \\ \begin{pmatrix} Z_{11} - \frac{Z_{12}^2(Z_L + Z_{22})}{Z_{22}(2Z_L + Z_{22})} & \frac{Z_{12}^2 Z_L}{Z_{22}(2Z_L + Z_{22})} \\ \frac{Z_{12}^2 Z_L}{Z_{22}(2Z_L + Z_{22})} & Z_{11} - \frac{Z_{12}^2(Z_L + Z_{22})}{Z_{22}(2Z_L + Z_{22})} \end{pmatrix} \quad (20)$$

Equations (18) and (19) may be used to solve for $Z_{12}$:

$$Z_{12} = \frac{\pm\sqrt{\frac{-2Z_L Z_{Thru_{21}}(Z_{Thru_{11}} - Z_{Thru_{21}} - Z_{LeftZL_{11}})}{(Z_{Thru_{11}} + Z_{Thru_{21}} - Z_{LeftZL11})}}}{Z_{Thru_{11}} - Z_{Thru_{21}} - Z_{LeftZL_{11}}} \quad (21)$$

The roots from equation (21) are then converted to magnitude and angle. The magnitude is determined as the square of $Z_{12}$ from equation (21) above. The angle is determined by correctly unwinding the phase to extract the valid root. The algorithm to convert the roots to magnitude and angle assumes that at low frequencies (close to DC) the phase will be negative since the fixture consists of a reciprocal network comprising passive components. It also assumes that the phase will be continuous when the frequency samples are small.

Figure 5:
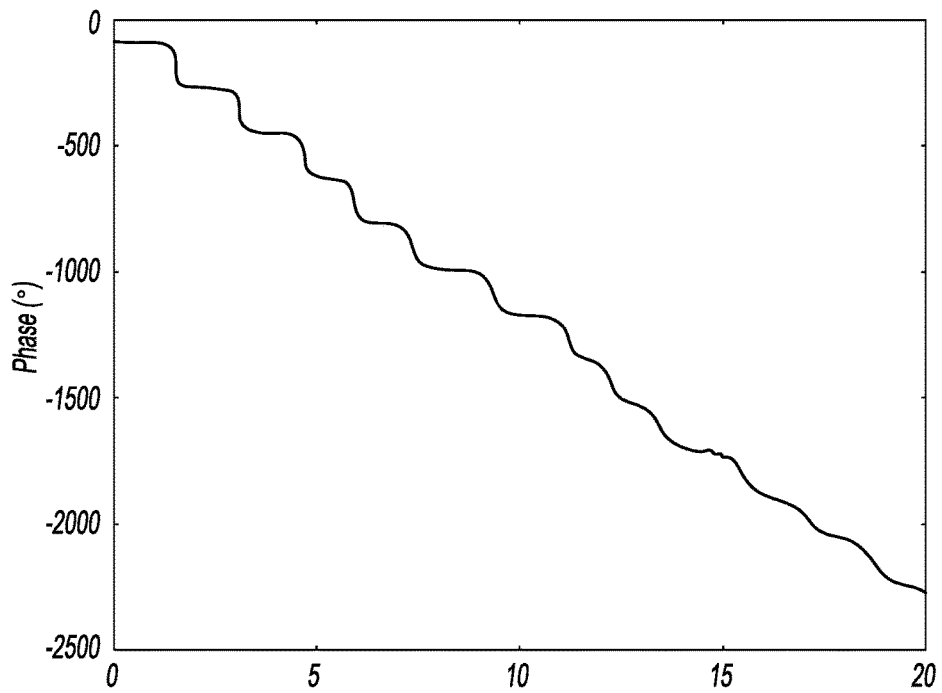
FIG. 5 shows the results of an algorithm used to unwind the phase in order to determine the correct root of the Z-parameters for the left test fixture.

The algorithm starts at the lowest frequency and selects the negative phase root. The unwinding algorithm then computes the next roots and compares each with the previous root to select the most continuous root with the least amount of discontinuity. In this manner, the algorithm selects the correct root and properly unwinds the phase. FIG. 5 shows the output of results of an example unwinding phase algorithm for the Z-parameters.

FIGS. 6-7 plot the real and imaginary results of the 2-port Z-parameters for the left HALF-THRU fixture. It should be recognized that the symmetry of the HALF-THRU fixture and model are consistent with a reciprocal network where, $$Z_{12} = Z_{21} \quad (22)$$

Figure 8:
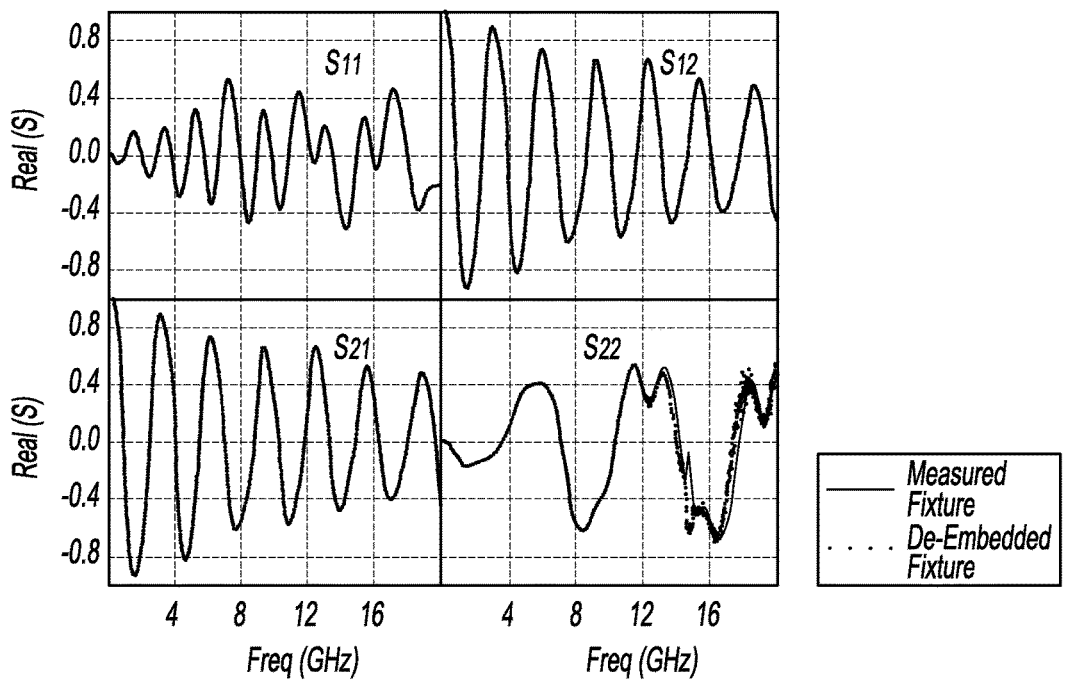
FIG. 8 is a plot of the real part of the 2-port, S-parameters for the left test fixture.
Figure 9:
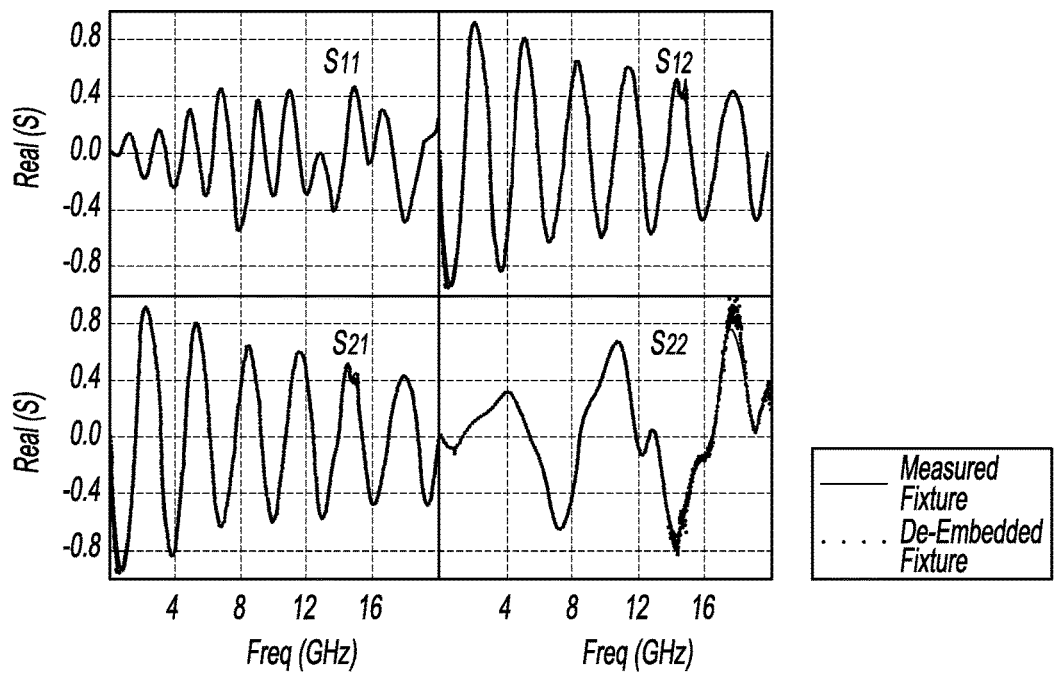
FIG. 9 is a plot of the imaginary part of the 2-port, S-parameters for the left test fixture.

FIGS. 8-9 plot the real and imaginary results of the 2-port S-parameters for the left HALF-THRU fixture. As depicted, the modeled S-parameters accurately model the fixture results.

De-Embedding and Calibration Fixtures

One benefit of the THRU-LOAD technique is that once the Z- or S-parameters for the HALF-THRU model are determined, the model may be used for simulations, calibrations or de-embedding. Further, the THRU-LOAD technique derives two mirror symmetric HALF-THRU models that pertain to the left and right HALF-THRU fixtures, respectively. Thus, care should be taken not to disassociate a HALF-THRU fixture with its corresponding HALF-THRU model.

In order to prevent the disassociation of a HALF-THRU fixture with its corresponding HALF-THRU model, one embodiment includes a memory storage circuit that attaches to the HALF-THRU fixture body which is configured to store the Z- or S-parameters. Ideally, the memory storage circuit would include circuitry to transfer the Z- or S-parameters from the memory storage to a test instrument, such as a VNA. The processor on the test instrument would then be configured to convert the S-parameters to T-parameters thereby de-embedding the HALF-THRU fixture and compensating accordingly. Alternatively, the test instrument could compute the equivalent calibration error terms from the Z- or S-parameters of the HALF-THRU fixture so as to move the calibrated reference plane to the HALF-THRU fixture's reference plane.

Attaching at least one memory storage circuit to the HALF-THRU fixture is beneficial for probes since probes are relatively sturdy and are sufficiently large to incorporate a memory storage circuit and peripheral circuitry. Care, however, should be taken to ensure that no damage incurs on the probes so as to invalidate the HALF-THRU model. In this regard it may be beneficial to include at least one write-protected memory storage circuit of the Z- or S-parameters of the initial probe HALF-THRU model that could be retrieved for comparison. Having multiple memory storage circuit locations also provides greater flexibility for use of the HALF-THRU fixture probe. Additional data regarding matable connectors or cabling used to construct a new HALF-THRU model could be saved to the writable memory storage circuit without erasing the data associated with fundamental HALF-THRU fixture probe.

There may also be instances when probes may damage delicate circuitry and it is better to use fixtures constructed on printed circuit boards or microchips. In some cases, the fixtures may include connectors to a printed circuit board with transmission line connectors to a microchip. Such delicate circuits can be built to use the THRU-LOAD technique described above and accurately mimic the connected fixture. In some embodiments this may include printed circuit board and microchip applications, and it may be beneficial to attach a memory storage circuit to an interposing matable connector that inserts between the test fixture and VNA port connector. This provides a portable means to ensure that a HALF-THRU model remains with its corresponding HALF-THRU fixture.

It may be preferable in certain circumstances for the memory storage circuit to be small and contain integrated circuits, and for the memory storage medium to be made of non-volatile solid state integrated circuits such as flash memory. Ideally, the circuitry contains means to interface with the test instrument such as a VNA. It may also be preferable in certain circumstances to have automated insertion recognizable circuitry similar to USB such that when the HALF-THRU fixture is properly connected, a signal is sent to the test instrument whereupon the Z- or S-parameters stored on the memory storage circuit of the HALF-THRU is transferred to the test instrument. This provides feedback to the test instrument operator indicating that the HALF-THRU is properly connected and ready to use.

By having automated insertion recognizable circuitry for a HALF-THRU model associated with a HALF-THRU fixture through the memory storage circuit, each left and right HALF-THRU fixture may be used independently. This is significant because with the memory storage circuit in conjunction with the automated insertion recognizable circuitry, the left and right HALF-THRU fixtures could be switched without adverse effects in the measurement. That is to say, if the right HALF-THRU fixture is connected to the left connector on the test instrument and the left HALF-THRU fixture is connected on the right, the automated insertion recognizable circuitry will transfer the correct associated model with each connector to the test instrument. Further, dissimilar HALF-THRU fixtures of other HALF-THRU fixture pairs may be interchanged for measurements as long as each HALF-THRU model is stored in the associated HALF-THRU fixture.

Figure 10:
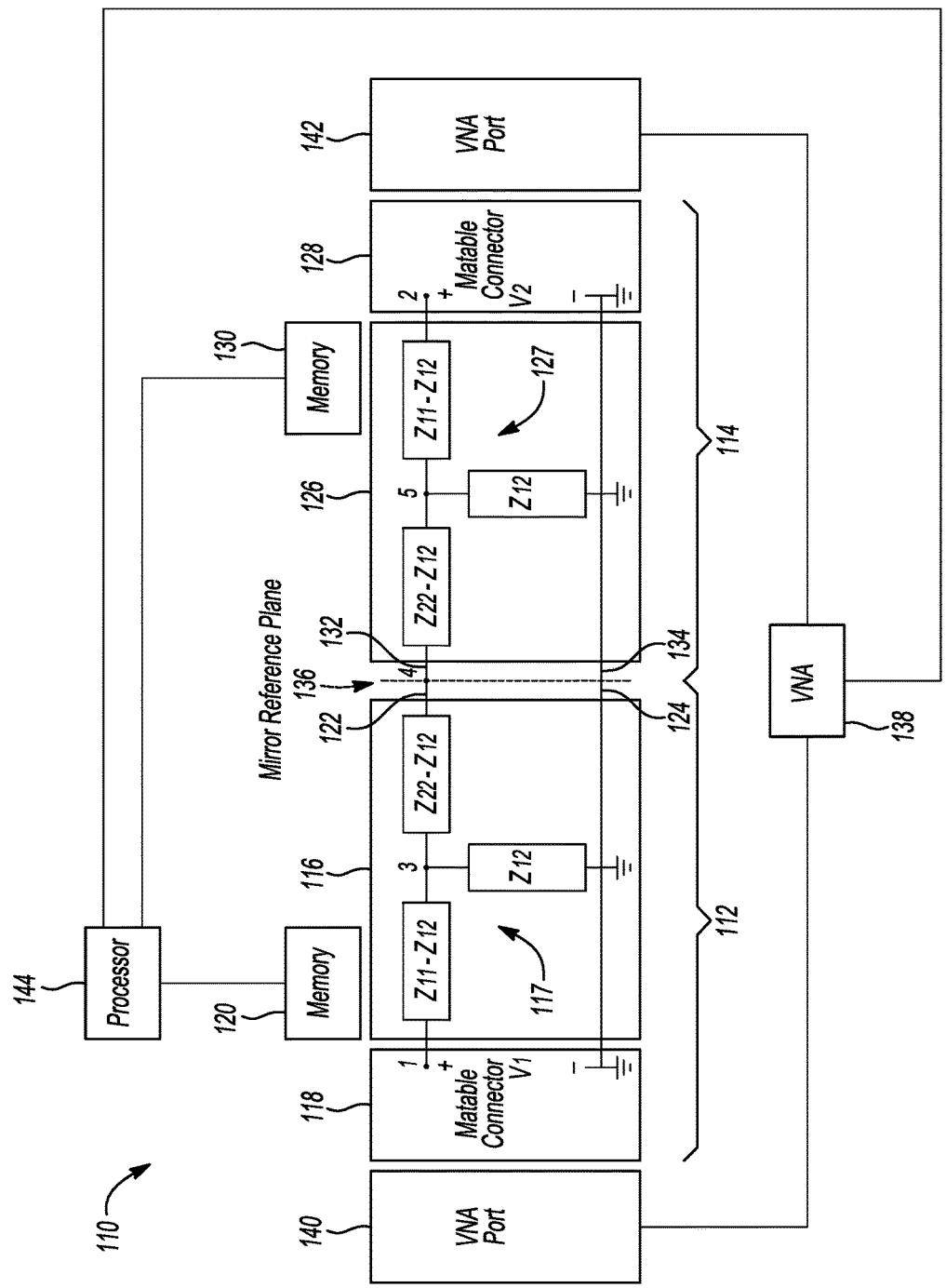
FIG. 10 is a connectivity diagram for a calibration arrangement in which a HALF-THRU (left side) connected to a VNA port and a second HALF-THRU (right side) connected to another VNA port are connected at the mirror symmetric plane to form a mirror symmetric THRU structure between the VNA ports.
Figure 12:
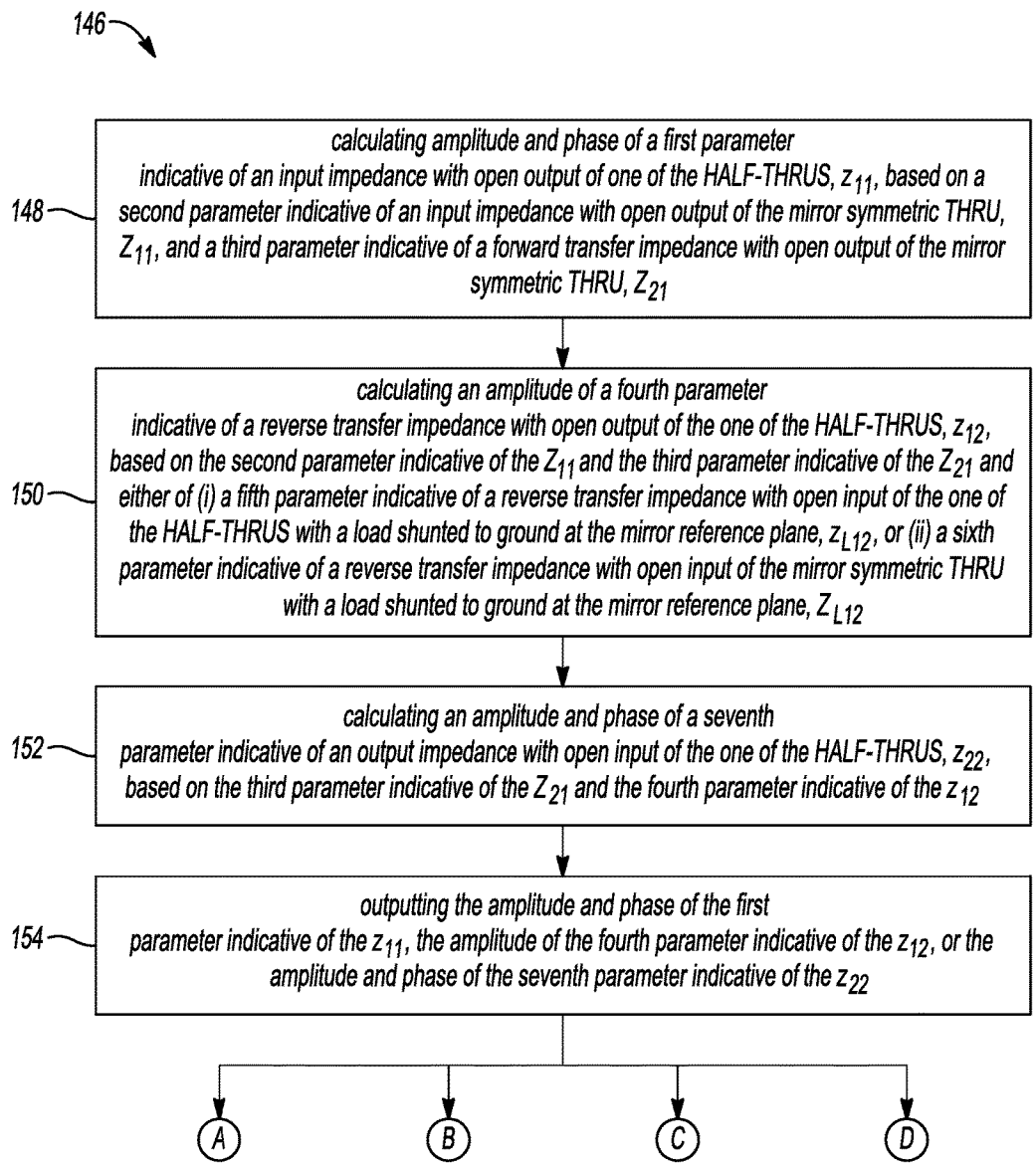
Figures 1, 12:
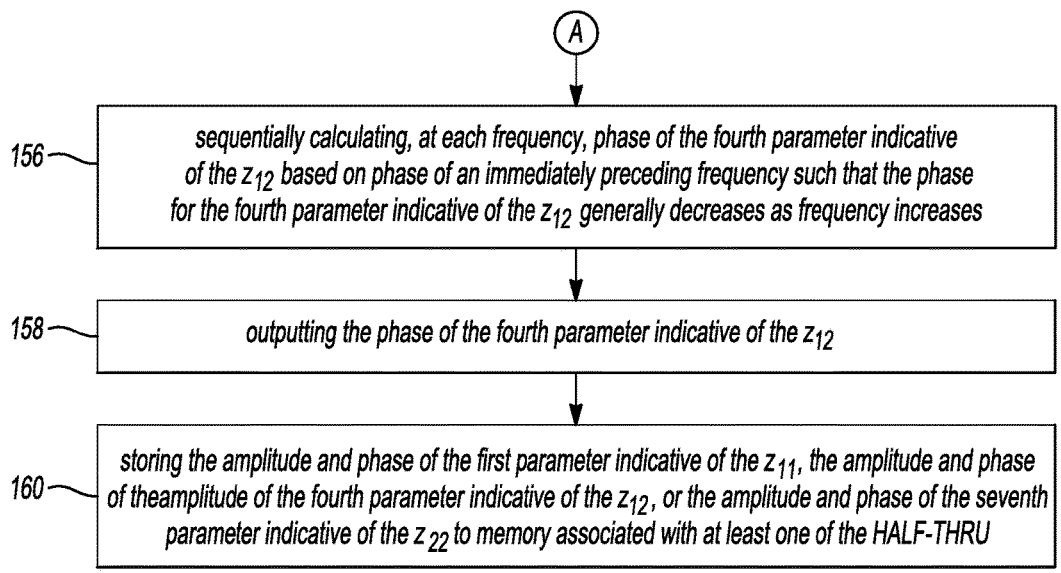
Figures 2, 12:
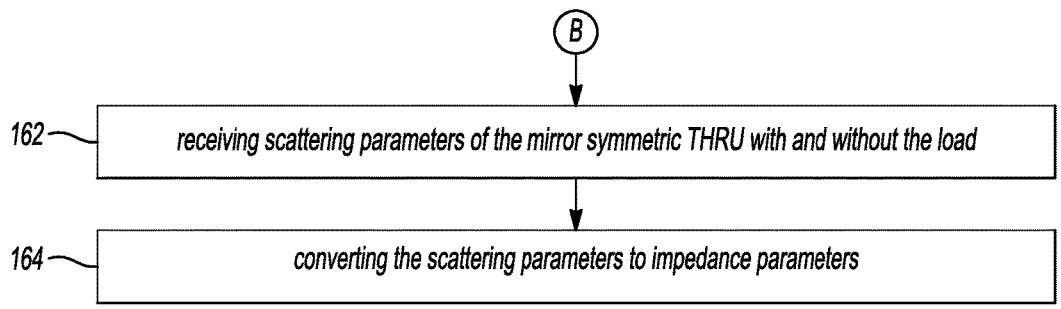
Figures 3, 12:
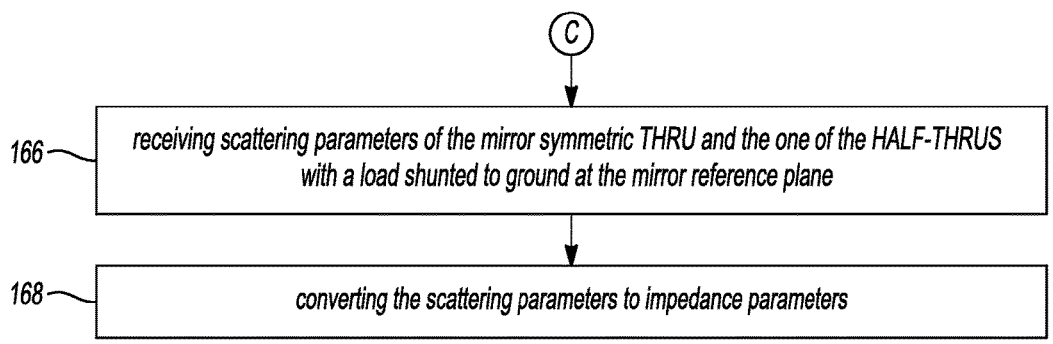
Figures 4, 12:
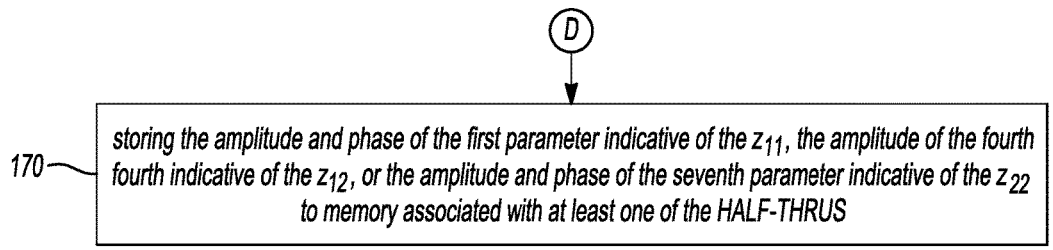
Figure 13:
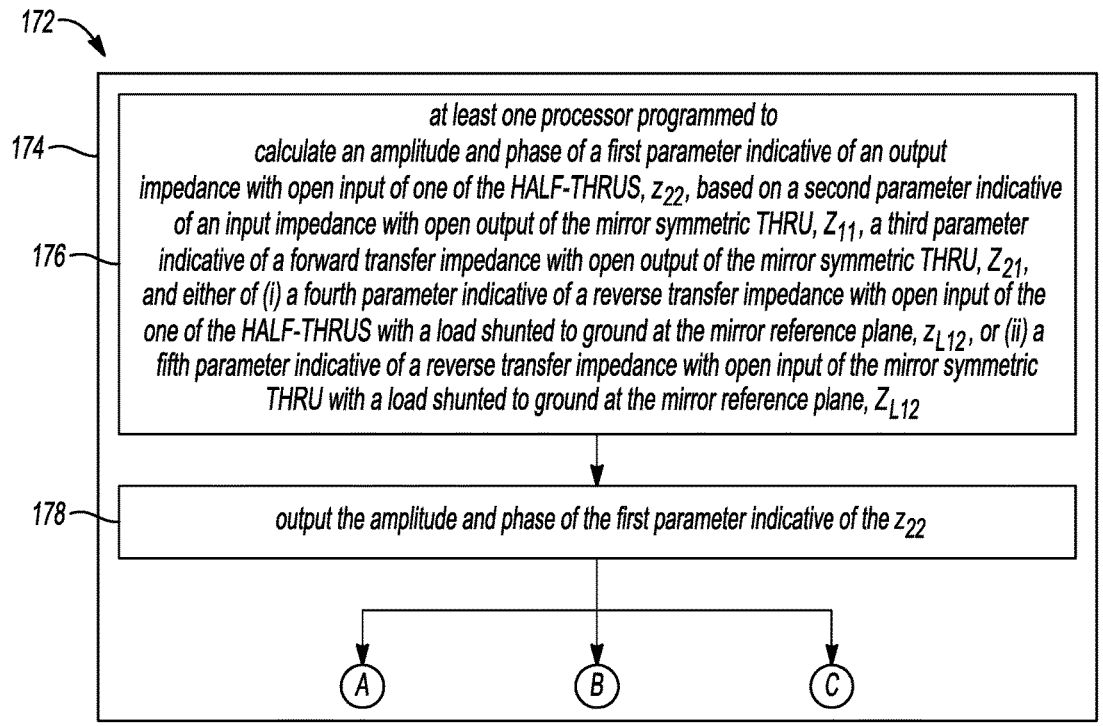
Figures 1, 13:
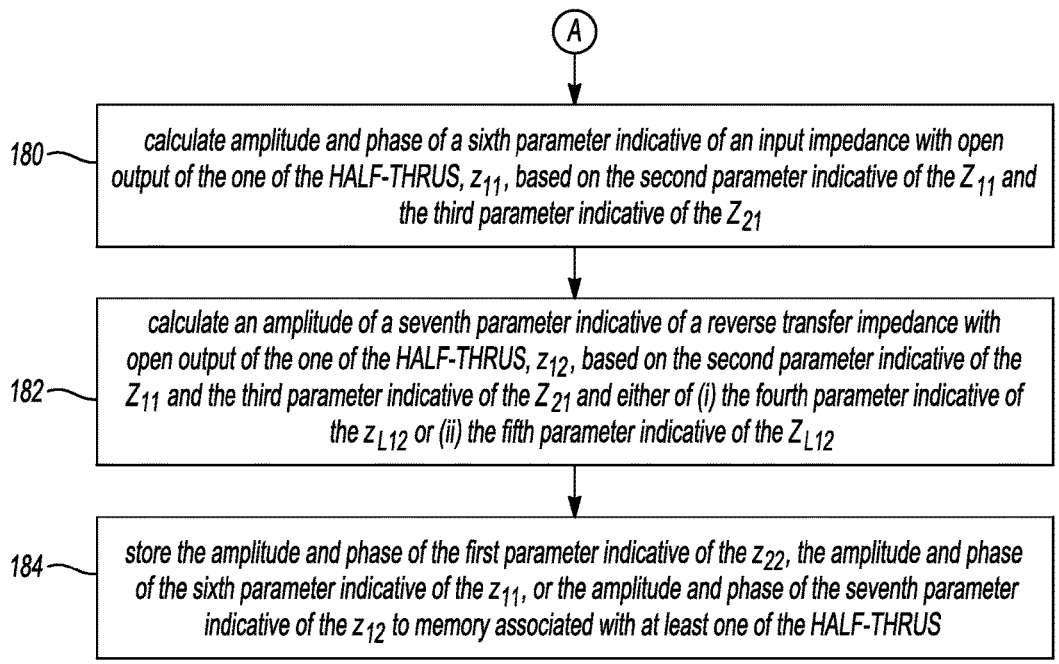
Figures 2, 13:
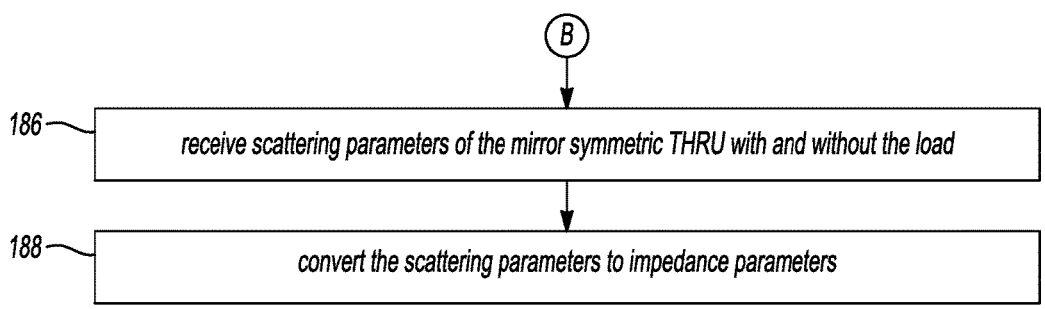
Figures 3, 13:
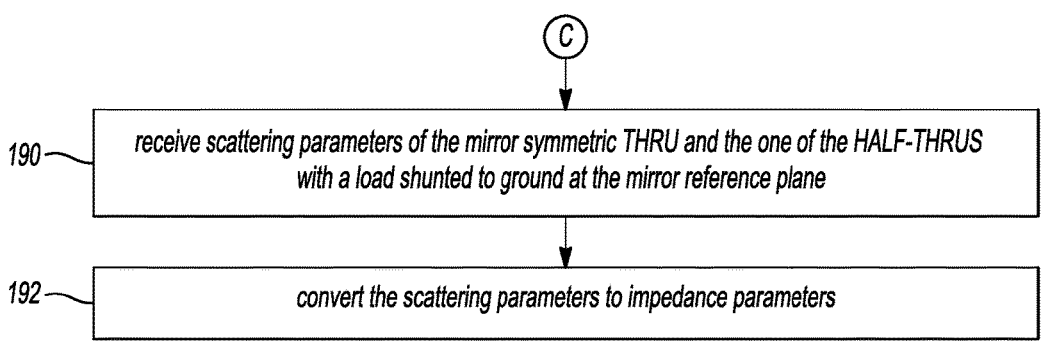

The calibration arrangement 110 of FIG. 10 includes HALF-THRUS 112, 114. The HALF-THRU 112 includes a fixture body 116 containing circuitry 117 (represented as a circuit model), a matable connector 118, memory 120 (e.g., a USB stick, etc.) attached in this example to the fixture body 116, and electrical leads 122, 124. Likewise, the HALF-THRU 114 includes a fixture body 126 containing circuitry 127 (represented as a circuit model), a matable connector 128, memory 130, and electrical leads 132, 134. The electrical leads 122, 132 and 124, 134 are connected at a mirror symmetric plane 136. In scenarios in which the fixture bodies 116, 126 are printed circuit boards, the circuit models 117, 127 represent traces. The calibration arrangement 110 further includes a VNA 138 with ports 140, 142, and a processor 144. (The VNA 138 in other examples may include a processor.) The HALF-THRUS 112, 114 are connected between ports 140, 142 during the calibrations procedures described herein.

Figure 11:
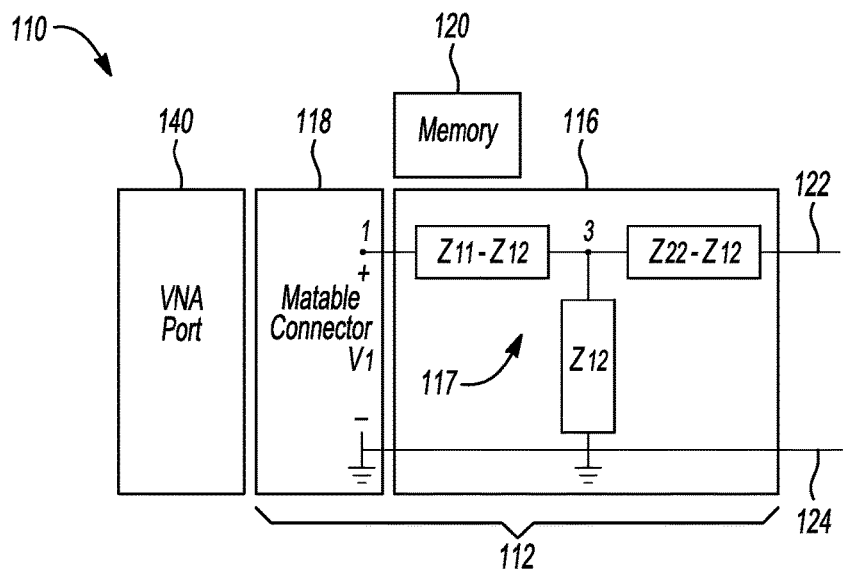
FIG. 11 is a connectivity diagram for a calibrated HALF-THRU (left side) connected to a VNA port with the associated calibrated data stored in the memory storage circuitry affixed to the body of the HALF-THRU.

The HALF-THRU 112 of FIG. 11, now disconnected from the calibration arrangement 110 and having calibration data stored within the memory 120, is ready for use.

FIGS. 12, 12-1, 12-2, 12-3, and 12-4 detail a method 146 for characterizing ports of a text fixture. Numeric relationships between the operations performed does not necessarily imply order. At operation 148, amplitude and phase of a first parameter indicative of an input impedance with open output of one of the HALF-THRUS, $z_{11}$, is calculated based on a second parameter indicative of an input impedance with open output of the mirror symmetric THRU, $Z_{11}$, and a third parameter indicative of a forward transfer impedance with open output of the mirror symmetric THRU, $Z_{21}$. At operation 150, an amplitude of a fourth parameter indicative of a reverse transfer impedance with open output of the one of the HALF-THRUS, $z_{12}$, is calculated based on the second parameter indicative of the $Z_{11}$ and the third parameter indicative of the $Z_{21}$ and either of (i) a fifth parameter indicative of a reverse transfer impedance with open input of the one of the HALF-THRUS with a load shunted to ground at the mirror reference plane, $z_{L12}$, or (ii) a sixth parameter indicative of a reverse transfer impedance with open input of the mirror symmetric THRU with a load shunted to ground at the mirror reference plane, $Z_{L12}$. At operation 152, an amplitude and phase of a seventh parameter indicative of an output impedance with open input of the one of the HALF-THRUS, $z_{22}$, is calculated based on the third parameter indicative of the $Z_{21}$ and the fourth parameter indicative of the $z_{12}$. At operation 154, the amplitude and phase of the first parameter indicative of the $z_{11}$, the amplitude of the fourth parameter indicative of the $z_{12}$, or the amplitude and phase of the seventh parameter indicative of the $z_{22}$ is output.

At operation 156, phase of the fourth parameter indicative of the $z_{12}$ is sequentially calculated at each frequency based on phase of an immediately preceding frequency such that the phase for the fourth parameter indicative of the $z_{12}$ generally decreases as frequency increases. At operation 158, the phase of the fourth parameter indicative of the $z_{12}$ is output. At operation 160, the amplitude and phase of the first parameter indicative of the $z_{11}$, the amplitude and phase of the amplitude of the fourth parameter indicative of the $z_{12}$, or the amplitude and phase of the seventh parameter indicative of the $z_{22}$ is stored to memory associated with at least one of the HALF-THRUS.

At operation 162, scattering parameters of the mirror symmetric THRU with and without the load are received. At operation 164, the scattering parameters are converted to impedance parameters.

At operation 166, scattering parameters of the mirror symmetric THRU and the one of the HALF-THRUS with a load shunted to ground at the mirror reference plane are received. At operation 168, the scattering parameters are converted to impedance parameters.

At operation 170, the amplitude and phase of the first parameter indicative of the $z_{11}$, the amplitude of the fourth parameter indicative of the $z_{12}$, or the amplitude and phase of the seventh parameter indicative of the $z_{22}$ is stored to memory associated with at least one of the HALF-THRUS.

FIGS. 13, 13-1, 13-2, and 13-3 detail an apparatus 172 for characterizing ports of a text fixture. The apparatus 172 includes at least one processor 174. At operation 176, the at least one processor calculates an amplitude and phase of a first parameter indicative of an output impedance with open input of one of the HALF-THRUS, $z_{22}$, based on a second parameter indicative of an input impedance with open output of the mirror symmetric THRU, $Z_{11}$, a third parameter indicative of a forward transfer impedance with open output of the mirror symmetric THRU, $Z_{21}$, and either of (i) a fourth parameter indicative of a reverse transfer impedance with open input of the one of the HALF-THRUS with a load shunted to ground at the mirror reference plane, $z_{L12}$, or (ii) a fifth parameter indicative of a reverse transfer impedance with open input of the mirror symmetric THRU with a load shunted to ground at the mirror reference plane, $Z_{L12}$. At operation 178, the at least one processor 174 outputs the amplitude and phase of the first parameter indicative of the $z_{22}$.

At operation 180, the at least one processor 174 calculates amplitude and phase of a sixth parameter indicative of an input impedance with open output of the one of the HALF-THRUS, $z_{11}$, based on the second parameter indicative of the $Z_{11}$ and the third parameter indicative of the $Z_{21}$. At operation 182, the at least one processor 174 calculates an amplitude of a seventh parameter indicative of a reverse transfer impedance with open output of the one of the HALF-THRUS, $z_{12}$, based on the second parameter indicative of the $Z_{11}$ and the third parameter indicative of the $Z_{21}$ and either of (i) the fourth parameter indicative of the $z_{L12}$ or (ii) the fifth parameter indicative of the $Z_{L12}$. At operation 184, the at least one processor 174 stores the amplitude and phase of the first parameter indicative of the $z_{22}$, the amplitude and phase of the sixth parameter indicative of the $z_{11}$, or the amplitude and phase of the seventh parameter indicative of the $z_{12}$ to memory associated with at least one of the HALF-THRUS.

At operation 186, the at least one processor 174 receives scattering parameters of the mirror symmetric THRU with and without the load. At operation 188, the at least one processor 174 converts the scattering parameters to impedance parameters.

At operation 190, the at least one processor 174 receives scattering parameters of the mirror symmetric THRU and the one of the HALF-THRUS with a load shunted to ground at the mirror reference plane. At operation 192, the at least one processor 174 converts the scattering parameters to impedance parameters.

The processes, methods, or algorithms disclosed herein may be deliverable to or implemented by a processing device, controller, or computer, such as VNA 138 or processor 144, which may include any existing programmable electronic control unit or dedicated electronic control unit. Similarly, the processes, methods, or algorithms may be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms may also be implemented in a software executable object. Alternatively, the processes, methods, or algorithms may be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. Z-parameters, for example, were used to facilitate discussion herein. Such parameters, however, belong to a family of parameters including H-parameters, T-parameters, Y-parameters, ABCD-parameters, etc. Therefore to the extent translations between parameter types are possible (e.g., $Y=Z^{-1}$, etc.), these other parameters can be used to implement the algorithms described herein and are considered to be parameters indicative of impedance.

The words used in the specification are words of description rather than limitation, and it is understood that various changes may be made without departing from the spirit and scope of the disclosure. As previously described, the features of various embodiments may be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. A method comprising:
arranging a pair of HALF-THRU fixtures connected at a mirror reference plane to form a mirror symmetric THRU structure; and
characterizing ports of a test fixture connected with the mirror symmetric THRU structure by
calculating, by at least one processor, amplitude and phase of a first parameter indicative of an input impedance with open output of one of the HALF-THRU fixtures, $Z_{11}$, based on a detected second parameter indicative of an input impedance with open output of the mirror symmetric THRU structure, $Z_{11}$, and a detected third parameter indicative of a forward transfer impedance with open output of the mirror symmetric THRU structure, $Z_{21}$,
calculating, by the at least one processor, an amplitude of a fourth parameter indicative of a reverse transfer impedance with open output of the one of the HALF-THRU fixtures, $Z_{12}$, based on the second parameter indicative of the $Z_{11}$ and the third parameter indicative of the $Z_{21}$ and either of (i) a detected fifth parameter indicative of a reverse transfer impedance with open input of the one of the HALF-THRU fixtures with a load shunted to ground at the mirror reference plane, $z_{L12}$, or (ii) a detected sixth parameter indicative of a reverse transfer impedance with open input of the mirror symmetric THRU structure with a load shunted to ground at the mirror reference plane, $Z_{L12}$,
calculating, by the at least one processor, an amplitude and phase of a seventh parameter indicative of an output impedance with open input of the one of the HALF-THRU, fixtures, $z_{22}$, based on the third parameter indicative of the $Z_{21}$ and the fourth parameter indicative of the $z_{12}$, and outputting, by the at least one processor, the amplitude and phase of the first parameter indicative of the $z_{11}$, the amplitude of the fourth parameter indicative of the $z_{12}$, or the amplitude and phase of the seventh parameter indicative of the $z_{22}$.

2. The method of claim 1 further comprising sequentially calculating at each frequency, by the at least one processor, phase of the fourth parameter indicative of the $z_{12}$ based on phase of an immediately preceding frequency such that the phase for the fourth parameter indicative of the $z_{12}$ generally decreases as frequency increases, and outputting, by the at least one processor, the phase of the fourth parameter indicative of the $z_{12}$.

3. The method of claim 2 further comprising storing, by the at least one processor, the amplitude and phase of the first parameter indicative of the $z_{11}$, the amplitude and phase of the amplitude of the fourth parameter indicative of the $z_{12}$, or the amplitude and phase of the seventh parameter indicative of the $z_{22}$ to memory associated with at least one of the HALF-THRU fixtures.

4. The method of claim 1 further comprising receiving, by the at least one processor, scattering parameters of the mirror symmetric THRU structure with and without the load.

5. The method of claim 4 further comprising converting, by the at least one processor, the scattering parameters to impedance parameters.

6. The method of claim 1 further comprising receiving, by the at least one processor, scattering parameters of the mirror symmetric THRU structure and the one of the HALF-THRU fixtures with a load shunted to ground at the mirror reference plane.

7. The method of claim 6 further comprising converting, by the at least one processor, the scattering parameters to impedance parameters.

8. The method of claim 1 further comprising storing, by the at least one processor, the amplitude and phase of the first parameter indicative of the $z_{11}$, the amplitude of the fourth parameter indicative of the $z_{12}$, or the amplitude and phase of the seventh parameter indicative of the $z_{22}$ to memory associated with at least one of the HALF-THRU fixtures.

9. An apparatus comprising:

a pair of HALF-THRU fixtures connected at a mirror reference plane and arranged to form a mirror symmetric THRU structure; and at least one processor programmed to characterize ports of a test fixture connected with the mirror symmetric THRU structure by calculating an amplitude and phase of a first parameter indicative of an output impedance with open input of one of the HALF-THRU fixtures, $z_{22}$, based on a detected second parameter indicative of an input impedance with open output of the mirror symmetric THRU structure, $Z_{11}$, a detected third parameter indicative of a forward transfer impedance with open output of the mirror symmetric THRU structure, $Z_{21}$, and either of (i) a detected fourth parameter indicative of a reverse transfer impedance with open input of the one of the HALF-THRU fixtures with a load shunted to ground at the mirror reference plane, $z_{L12}$, or (ii) a detected fifth parameter indicative of a reverse transfer impedance with open input of the mirror symmetric THRU structure with a load shunted to ground at the mirror reference plane, $Z_{L12}$, and outputting the amplitude and phase of the first parameter indicative of the $z_{22}$.

10. The apparatus of claim 9, wherein the at least one processor is further programmed to calculate amplitude and phase off sixth parameter indicative of an input impedance with open output of the one of the HALF-THRU fixtures, $z_{11}$, based on the second parameter indicative of the $Z_{11}$ and the third parameter indicative of the $Z_{21}$.

11. The apparatus of claim 10, wherein the at least one processor is further programmed to calculate an amplitude of a seventh parameter indicative of a reverse transfer impedance with open output of the one of the HALF-THRU fixtures, $z_{12}$ based on the second parameter indicative of the $Z_{11}$ and the third parameter indicative of the $Z_{21}$ and either of (i) the fourth parameter indicative of the $z_{L12}$ or (ii) the fifth parameter indicative of the $Z_{L12}$.

12. The apparatus of claim 11, wherein the at least one processor is further programmed to store the amplitude and phase of the first parameter indicative of the $z_{22}$, the amplitude and phase of the sixth parameter indicative of the $z_{11}$, or the amplitude and phase of the seventh parameter indicative of the $z_{12}$ to memory associated with at least one of the HALF-THRU fixtures.

13. The apparatus of claim 9, wherein the at least one processor is further programmed to receive scattering parameters of the mirror symmetric THRU structure with and without the load.

14. The apparatus of claim 13, wherein the at least one processor is further programmed to convert the scattering parameters to impedance parameters.

15. The apparatus of claim 9, wherein the at least one processor is further programmed to receive scattering parameters of the mirror symmetric THRU structure and the one of the HALF-THRU fixtures with a load shunted to ground at the mirror reference plane.

16. The apparatus of claim 15, wherein the at least one processor is further programmed to convert the scattering parameters to impedance parameters.

* * * * *

UNITED STATES PATENT AND TRADEMARK OFFICE
CERTIFICATE OF CORRECTION

PATENT NO. : 10,429,482 B2  
APPLICATION NO. : 14/292275  
DATED : October 1, 2019  
INVENTOR(S) : Frei et al.

Page 1 of 1

It is certified that error appears in the above-identified patent and that said Letters Patent is hereby corrected as shown below:

In the Claims

In Column 12, Line 44, in Claim 1, delete "$Z_{11}$," and insert -- $z_{11}$, --, therefor.

In Column 12, Line 53, in Claim 1, delete "$Z_{12}$," and insert -- $z_{12}$, --, therefor.

In Column 12, Line 67, in Claim 1, delete "HALF-THRU," and insert -- HALF-THRU --, therefor.

In Column 14, Line 20, in Claim 10, delete "off" and insert -- of a --, therefor.

In Column 14, Line 28, in Claim 11, delete "$z_{12}$" and insert -- $z_{12}$, --, therefor.

Signed and Sealed this  
Eighth Day of September, 2020

Andrei Iancu  
*Director of the United States Patent and Trademark Office*